US 6,624,765 B2

United States Patent
Freidhof et al.

(10) Patent No.: US 6,624,765 B2
(45) Date of Patent: Sep. 23, 2003

(54) APPARATUS AND METHOD FOR SAMPLING RATE CONVERSION

(75) Inventors: Markus Freidhof, Taufkirchen (DE); Kurt Schmidt, Grafing (DE)

(73) Assignee: Rohde & Schwarz GmbH & Co., KG, Munich (DE)

( * ) Notice: Subject to any disclaimer, the term of this patent is extended or adjusted under 35 U.S.C. 154(b) by 0 days.

(21) Appl. No.: 10/061,700

(22) Filed: Feb. 1, 2002

(65) Prior Publication Data

US 2002/0105447 A1 Aug. 8, 2002

(30) Foreign Application Priority Data

Feb. 6, 2001 (DE) ......................... 101 05 256

(51) Int. Cl.[7] .............................................. H03M 7/00
(52) U.S. Cl. ................................ 341/61; 341/144
(58) Field of Search ....................... 341/61, 123, 111, 341/113, 114, 144; 375/350, 229; 708/313, 315, 300, 420; 370/545; 377/48

(56) References Cited

U.S. PATENT DOCUMENTS

| | | | |
|---|---|---|---|
| 5,365,468 A | 11/1994 | Kakubo et al. | 708/313 |
| 5,617,088 A | 4/1997 | Yasuda | 341/61 |
| 5,786,778 A * | 7/1998 | Adams et al. | 341/61 |
| 5,880,687 A * | 3/1999 | May et al. | 341/61 |
| 6,005,901 A * | 12/1999 | Linz | 375/355 |
| 6,057,789 A | 5/2000 | Lin | 341/61 |
| 6,061,410 A | 5/2000 | Linz | 341/61 |
| 6,208,671 B1 * | 3/2001 | Paulos et al. | 370/545 |
| 6,215,839 B1 * | 4/2001 | Lin | 377/48 |
| 6,518,894 B2 * | 2/2003 | Freidhof | 341/61 |

FOREIGN PATENT DOCUMENTS

EP 0 665 546 A2 8/1995

OTHER PUBLICATIONS

US application No. 10/045,161, Freidhof et al., "Device and mehod for sampling rate conversion", filing date Jan. 15, 2002.*

* cited by examiner

*Primary Examiner*—Jean Bruner Jeanglaude
(74) *Attorney, Agent, or Firm*—Harness, Dickey & Pierce, P.L.C.

(57) ABSTRACT

A resampler converts a digital input sequence with an input sampling into a digital output signal sequence with an output sampling rate. An estimation device estimates the sampling rate ratio between the input sampling rate and the output sampling rate and the desired phase of the output signal sequence in an observation interval with a predetermined length of N samples of the output signal sequence, the observation intervals overlapping in the ratio 1:6. A control device compares the actual phase of the output signal sequence with the desired phase and, in a manner dependent on the estimated sampling rate ratio and the deviation of the actual phase from the desired phase, generates a control signal for in each case N/6 samples of the output signal sequence. An interpolator interpolates the input signal sequence for the purpose of generating the output signal sequence at sampling instants whose temporal position is predetermined by a control signal.

10 Claims, 5 Drawing Sheets

- - - Non-overlapping observation int.
—— Overlapping observation int.

FIG. 10

APPARATUS AND METHOD FOR SAMPLING RATE CONVERSION

This application claims priority to German Patent Application 101 05 256.1, filed Feb. 6, 2001, the entire contents of which are hereby incorporated by reference.

BACKGROUND OF THE INVENTION

1. Field of the Invention

The invention relates to an apparatus for converting a digital input signal sequence with an input sampling rate into a digital output signal sequence with an output sampling rate which differs from the input sampling rate. Such an apparatus is generally referred to as a resampler. The invention furthermore relates to a corresponding method.

2. Related Art

Such a resampler is disclosed for example in EP 0 665 546 A2. In a resampler, it is necessary firstly to detect the ratio of the input sampling rate to the output sampling rate. This is done by way of a gate time measurement in the document mentioned above. In an interpolator the samples are interpolated from the samples of the input signal sequence at the output sampling instants predetermined by the output sampling rate. In this case, the interpolator is controlled by the detected sampling rate ratio. Since the detection of the sampling rate ratio is subject to measurement inaccuracies, buffering in a buffer memory, for example a FIFO, is effected at the output of the interpolator in the case of down-sampling and at the input of the interpolator in the case of up-sampling. The integral behavior of the FIFO memory is utilized in this case. EP 0 665 546 A1 proposes controlling the sampling rate ratio, which drives the interpolator, in a manner dependent on the occupancy of the buffer memory.

The control of the sampling rate ratio in a manner dependent on the occupancy of the buffer memory as proposed in EP 0 665 546 A2 has the disadvantage that when the occupancy of the buffer memory changes, the group delay of the digital signal through the resampler changes. In the case of application e.g. in mobile radio technology, relatively large changes in occupancy of the buffer memory of (e.g. +/−1), i.e. a change by a memory unit, are unacceptable since they lead to delay fluctuations in the signal through the resampler. In the case of the occupancy controller of the buffer memory which is proposed in EP 0 665 546 A1, deviations of the clock rate ratio are identified relatively late, when a relatively large detuning of the ratio has already taken place. This leads to larger interpolation errors on account of incorrect sampling instants.

A resampler with phase estimation but without overlapping observation intervals is described in DE 101 02 166 A1, which was published after the priority date.

SUMMARY OF THE INVENTION

The present invention is based on the object of providing an apparatus (resampler) and a method (resampling method) for converting a digital input signal sequence with an input sampling rate into a digital output signal sequence with an output sampling rate, which apparatus and which method operate with high accuracy.

An object is achieved by way of the features of claim 1 with regard to the apparatus, and by way of the features of claim 5 with regard to the method. The dependent claims contain advantageous developments of the apparatus and of the method, respectively.

The present invention is based on the insight that the accuracy in the driving of the interpolator or the definition of the sampling instants of the output signal sequence can be considerably increased if the control is effected not only on the basis of an estimation of the sampling rate ratio between the input sampling rate and the output sampling rate but at the same time on the basis of an estimation of the phase angle with overlapping observation intervals. Through the phase-coherent control according to the present invention, a deviation of the sampling rate ratio is already detected before said deviation is so large that it leads to an increase or decrease in the memory level in the buffer memory (FIFO). A large change, associated with the memory level change, in the group delay through the resampler is thus avoided and the interpolation accuracy of the interpolator is increased. The reaction time of the control is shortened by virtue of the overlapping observation intervals.

BRIEF DESCRIPTION OF THE DRAWINGS

An exemplary embodiment of the resampler according to the present invention and of the resampling method according to the present invention is described in more detail below with reference to the drawing, in which.

DETAILED DESCRIPTION OF THE PREFERRED EMBODIMENTS

Figure 1:
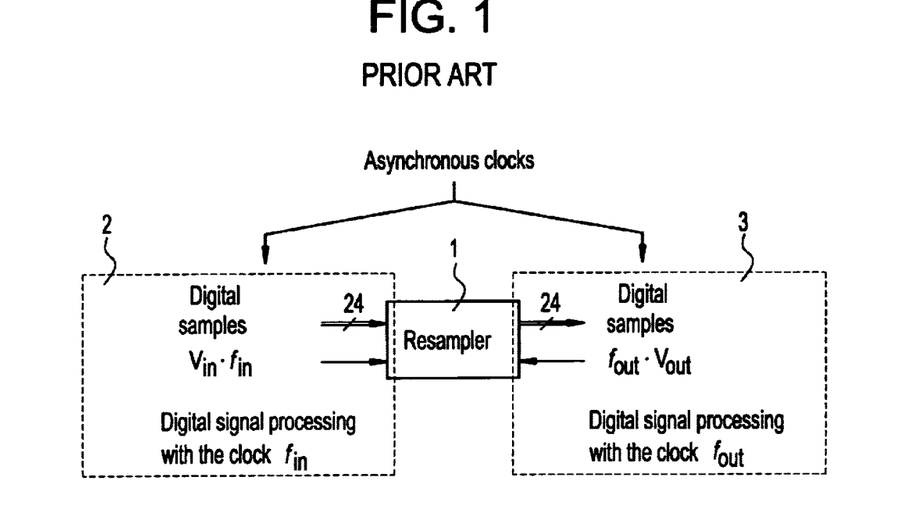
FIG. 1 illustrates a schematic illustration of a resampler.

FIG. 1 illustrates the basic principle, underlying the present invention, of a resampler 1. Connected to the resampler 1 are a first digital signal processing 2 operating with the clock $f_{in}$ and a second digital signal processing 3 operating with the clock $f_{out}$. The first digital signal processing 2 generates digital samples, for example with a width of 24 bits, which are fed to the resampler 1. Furthermore, the clock $V_{in} \cdot f_{in}$ of the first digital signal processing 2 and the clock $V_{out} \cdot f_{out}$ of the second digital signal processing 3 are fed to the resampler (sampling rate converter). $V_{in}$ and $V_{out}$ are integer multiples and may preferably be equal to one. The clocks $f_{in}$ and $f_{out}$ are generally asynchronous and are in an arbitrary, generally non-integer, ratio with respect to one another. The resampler 1 has the task of converting the digital samples of the first digital signal processing 2 operating with the clock $f_{in}$ into digital samples of the second digital signal processing 3 operating with the clock $f_{out}$. Down-sampling is involved for the case where $f_{out}$ is less than $f_{in}$. Up-sampling is involved for the case where $f_{out}$ is greater than $f_{in}$.

Figure 2:
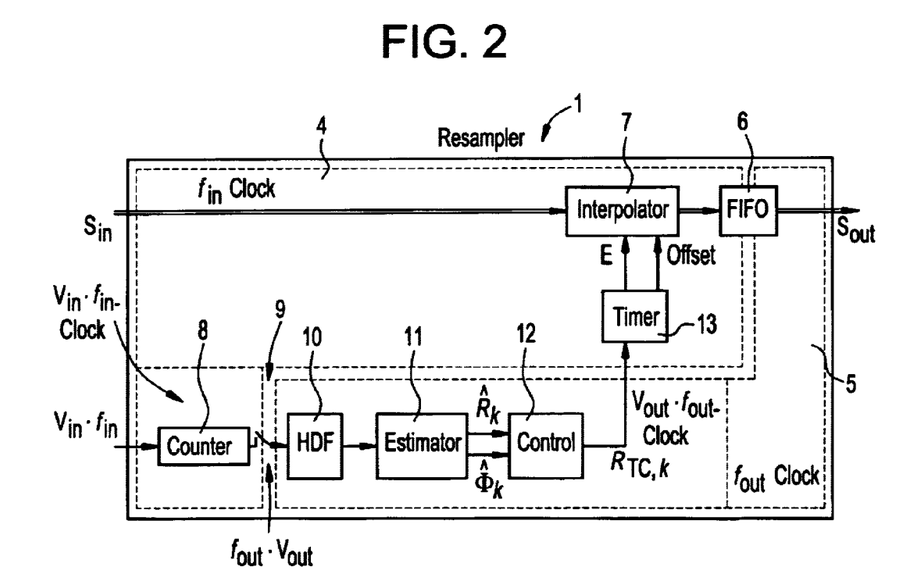
FIG. 2 illustrates a block diagram of a resampler according to the present invention.
Figure 8:
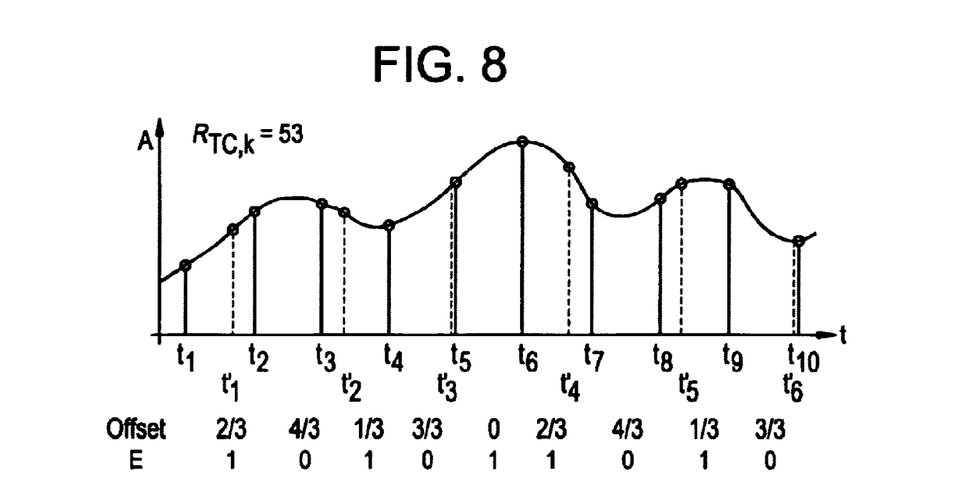
FIG. 8 illustrates a diagram for elucidating the method of operation of the timer illustrated in FIG. 4.

FIG. 2 illustrates an exemplary embodiment of a resampler 1 according to the present invention. The case of down-sampling is illustrated. A first block 4 of the resampler 1 operates with the input clock $f_{in}$, while a second block 5 of the resampler 1 operates with the output clock $f_{out}$. The digital input signal sequence $S_{in}$ fed to the resampler is fed with the clock $f_{in}$ to an interpolator 7. In the interpolator 7, interpolation is effected for the purpose of generating the samples of the output signal sequence $S_{out}$ at the sampling instants corresponding to the output sampling rate $f_{out}$. This is illustrated in FIG. 8. The samples A at the sampling instants $t_1, t_3, \ldots t_{10}$ correspond to the input signal sequence $S_{in}$, while the samples A at the sampling instants $t'_1, t'_2, \ldots t'_6$ correspond to the output signal sequence $S_{out}$.

In the case of down-sampling illustrated, a buffer memory 6 is connected downstream of the interpolator 7, said buffer memory being embodied as a FIFO (first-in first-out) in the exemplary embodiment. The buffer memory 6 serves, in particular during a transient phase, for buffering the samples which are generated by the interpolator 7 and are picked off at the output of the buffer memory 6 with the clock $f_{out}$. The aim of the present invention is to keep the occupancy of the buffer memory 6 exactly constant and to avoid fluctuations in occupancy of the buffer memory 6. Therefore, unlike in the prior art, the interpolator 7 is not controlled on the basis of an occupancy detection of the buffer memory 6, since such control can only intervene if the occupancy of the buffer memory 6 has changed by at least 1. Rather, the control according to the present invention is based, in addition to an estimation of the sampling rate ratio $R=f_{in}/f_{out}$, on an additional estimation of the phase angle Φ of the output sampling rate $f_{out}$ in relation to the input sampling rate $f_{in}$.

In order to detect the sampling rate ratio R, the input sampling rate $f_{in}$ is fed to a counter 8, whose output is sampled with the output sampling rate $f_{out}$ at a sampling element 9. In the initial example, the signal thus generated passes through a 1st order cascaded integrate comb filter (CIC filter) 10. An estimator 11 for estimating the sampling rate ratio R and the phase angle Φ is connected downstream of said CIC filter 10. The estimator 11 in each case evaluates an observation interval comprising N samples. According to the present invention, the observation intervals overlap in the ratio 1:n, e.g. 1:6. For each overlapping observation interval, the estimator 11 generates an estimated value $R_k$ for the sampling rate ratio $f_{in}/f_{out}$ and for the phase $\Phi_k$ of the phase angle of the output clock $f_{out}$. These estimated values are fed to a control device 12, which generates a control signal $R_{TC,k}$ from them. This control signal $R_{TC,k}$ is fed to a timer 13, which generates a time offset signal Offset, which identifies the sampling instants $t'_1, t'_2, \ldots t'_6$ of the output signal sequence $s_{out}$ in relation to the sampling instants $t_1, t_2, \ldots, t_{10}$ of the input signal sequence $S_{in}$, and an indicator signal E, which identifies whether or not a sampling instant of the output signal sequence $S_{out}$ lies in a specific sampling interval of the input signal sequence $S_{in}$.

The individual elements of the resampler 1 according to the present invention as illustrated in FIG. 2 are described in detail below.

Figure 3:
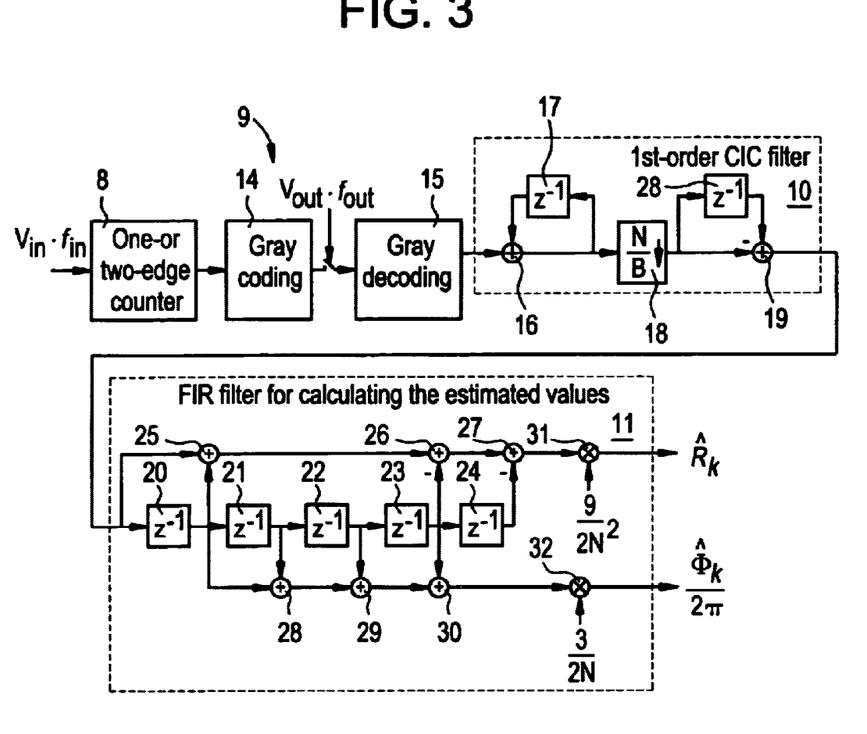
FIG. 3 illustrates a block diagram of a detailed segment of the resampler according to the present invention for determining the sampling rate ratio and the phase angle.

FIG. 3 illustrates a block diagram of the elements for obtaining the sampling rate ratio R, the CIC filter 10 and also the estimator 11.

In the case of down-sampling illustrated in FIG. 2, the input sampling rate $f_{in}$ is fed to the counter 8, which may be designed as a one- or two-edge counter. The target values of the counter 8 are fed to a Gray coder 14, which carries out Gray coding of the target values. As is known, Gray coding has the property that only one bit in each case changes in the event of incrementing or decrementing. The error in the subsequent sampling with the output sampling rate $f_{out}$ in the sampling element 9 is therefore a maximum of 1 bit. The Gray coding is reversed again in the downstream Gray decoder 15. The Gray coder 14 and the Gray decoder 15 are optional and can also be omitted. The sampling rate ratio can also be determined in a different manner than by way of counter sampling. The functions of $f_{in}$ and $f_{out}$ are to be interchanged in the case of up-sampling.

In the exemplary embodiment illustrated, the output signal of the Gray decoder 15 is fed to a 1st-order CIC filter 10. The samples are continuously summed in a first stage comprising an adder 16 and a delay element 17. In a sampling converter 18, the sampling rate is lowered by the factor N/n, the observation intervals of length N being intended to overlap by 1:n, i.e. only every N/n-th value of the output of the adder 16 is selected for further processing. In a second stage comprising a subtractor 19 and a delay element 28, the start value is in each case subtracted from the end value of a block of length N/n, i.e. the values at the output of the CIC filter 10 represent the blockwise sum of in each case N/n samples. These blockwise sum values are fed to the estimator 11. n=6 holds true in the exemplary embodiment illustrated.

The estimator 11 comprises a chain of a plurality of delay elements 20, 21, 22, 23 and 24. Selected start, intermediate and end values of this delay chain 20–24 are fed to adders 25, 26 and 27 for calculating the estimated values for the sampling rate ratio and to further adders 28, 29 and 30 for calculating the estimated values for the phase. Suitable scaling is effected in multipliers 31 and 32. At the output of the estimator 11, an estimated value $R_k$ for the sampling rate ratio and an estimated value—normalized to 2π—for the phase $\Phi_k/2\pi$ are available for each observation interval comprising N input values. In this case, the observation intervals overlap in the ratio 1:n, in the ratio 1:6 in the exemplary embodiment. n−1 delay elements 20–24 are to be made available. If n is not equal to 6, then the arrangement of the adders 25–30 is to be adapted accordingly.

The exact mode of operation of the estimator illustrated in FIG. 3 is described in detail in the patent application DE 100 39 666 A1 of the same applicant and the same inventors. The content of this patent application DE 100 39 666 A1 is incorporated in its entirety in the present patent application.

Figure 4:
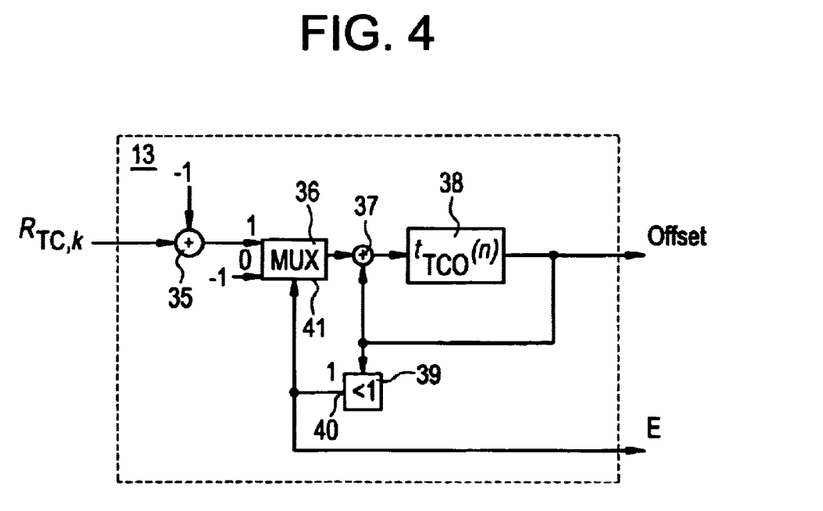
FIG. 4 illustrates a block diagram of the timer of the resampler according to the present invention.

FIG. 4 illustrates a block diagram of the timer 13. The control device 12 generates a control signal $R_{TC,k}$ from the estimated values of the sampling rate ratio $R_k$ and the estimated values of the phase $\Phi_k$ in a manner that will be described in more detail with reference to FIG. 5, which control signal is fed to the timer 13. The control signal $R_{TC,k}$ is reduced by 1 in an adder 35. The task of the timer 13 is to communicate to the interpolator 7 a time offset signal (Offset) which identifies the sampling instants $t'_1, t'_2, \ldots t'_6$ of the output signal sequence $S_{out}$ in relation to the sampling instants $t_1, t_2 \ldots t_{10}$ of the input signal sequence $S_{in}$. In this case, the sampling period of the input signal sequence $S_{in}$ is normalized to 1 in the exemplary embodiment. In the case of a different normalization, the corresponding normalization quantity would have to be subtracted instead of 1. Furthermore, the timer 13 generates an indicator signal E, which indicates to the interpolator 7 whether a sampling instant of the output signal sequence $S_{out}$ lies in the next sampling period of the input signal sequence $S_{in}$.

The output of the adder 35 is connected to a changeover device (multiplexer MUX) 36. If the changeover device 36 receives a logic "1" at its switching input 41, then it connects its output to the adder 35. Otherwise, its output is connected to the other input, at which the value −1 is continuously present. The output of the changeover device 36 is connected to an adder 37. The output of the adder 37 is connected to a delay element 38, which shifts the digital values in each case by a sampling period $t_{TC0}(n)$, e.g. $t_2-t_1$, of the input signal sequence $S_{in}$. The output of the delay element 38 is connected to the second input of the adder 37 and to a detector 39. The detector 39 ascertains whether the present output value of the delay element 38 is greater than or less than 1. If the present output value of the delay element 38 is less than 1, then the detector 39 generates a logic "1" at its output 40, otherwise a logic "0". Thus, if the present output value of the delay element 38 (register) is less than 1, then the value $R_{TC,k}-1$ is applied to the input of the adder 37, otherwise the value −1 is applied to the input of the adder 37 via the changeover element 36. The output values of the delay element 38 form the time offset signal Offset, while the output values of the detector 39 form the indicator signal E.

The mode of operation of the timer 13 illustrated in FIG. 4 and of the interpolator 7 is explained below with reference to FIG. 8. FIG. 8 illustrates a signal of amplitude A which is sampled in accordance with the input signal sequence $S_{in}$ at the sampling times $t_1, t_2, t_3, t_4, t_5, t_6, t_7, t_8, t_9$ and $t_{10}$. After the resampling in the resampler 1, the signal is sampled at the sampling instants $t'_1, t'_2, t'_3, t'_4, t'_5$ and $t'_6$. The temporal position of the sampling instants $t'_1, t'_2, \ldots t'_6$ of the output signal sequence $S_{out}$ in relation to the sampling instants $t_1, t_2, \ldots t_{10}$ of the input signal sequence $S_{in}$ is indicated to the interpolator 7 by the timer 13 by way of the time offset signal Offset and the indicator signal E.

In the example illustrated in FIG. 8, it is assumed that the control signal $R_{TC,k}=\frac{5}{3}$. The control signal $R_{TC,k}$ is essentially the sampling rate ratio $R=f_{in}/f_{out}$ which, however, is controlled according to the present invention on the basis of the phase estimation in a manner which will be described in more detail with reference to FIGS. 5 to 7. It is furthermore assumed that the start value in the delay element (register) 38 for the time offset signal Offset=$\frac{2}{3}$. Since $\frac{2}{3}<1$, the indicator signal E=1. For the interpolator 7 this means that, at a sampling instant $t'_1$, which succeeds the sampling instant $t_1$ by $\frac{2}{3}$ of the sampling period of the input signal sequence $S_{in}$, a sample of the output signal sequence $S_{out}$ must be generated by interpolation.

The changeover device 36 connects the input of the adder 37 to the adder 35, so that the value $R_{TC,k}-=\frac{2}{3}$ is added to the register reading of the delay element (register) 38 and the value Offset =$\frac{4}{3}$ now appears at the output of the delay element (register) 38. Since it is true that $\frac{4}{3}>1$, the output of the detector 39 is now "0" and the interpolator 7 carries out no interpolation between $t_2$ and $t_3$ on account of this state of the indicator signal E=0. In the subsequent clock cycle, −1 is applied to the input of the adder 37 on account of the logic state "0" of the output of the detector 39 and the signal Offset at the output of the delay element (register) 38 becomes Offset =$\frac{1}{3}$. Since it is true that $\frac{1}{3}<1$, the indicator signal E=1 ensues. The interpolator 7 thus carries out an interpolation at a position which is shifted by $\frac{1}{3}$ of the sampling period of the input signal sequence $S_{in}$ after the instant $t_3$, that is to say at the position $t'_2$ in FIG. 8, for the purpose of generating the next value of the output signal sequence $S_{out}$.

In the next clock cycle, the value $R_{TC,k}-1=\frac{2}{3}$ is again applied to the adder 37 so that the output of the delay element (register) assumes the value $\frac{3}{3}=1$. The output of the detector 39 is thus "0" and the indicator signal E=0, so that no interpolation is effected between the instants $t_4$ and $t_5$. In the next clock cycle, −1 is applied to the input of the adder 37 and the output of the delay element (register) 38 becomes 0. Since the indicator signal E is set to "1" by the detector 39, the next interpolation is thus effected at the instant $t'_3=t_5$. The series can be continued in the manner specified in FIG. 8. In the timer 13, $R_{TC,k}$ are always used for generating $N/(n \cdot V_{out})$ samples of the output signal sequence $S_{out}$.

The construction and the function of an exemplary embodiment of the control device 12 are described in more detail below with reference to FIGS. 5 to 7.

Figure 5:
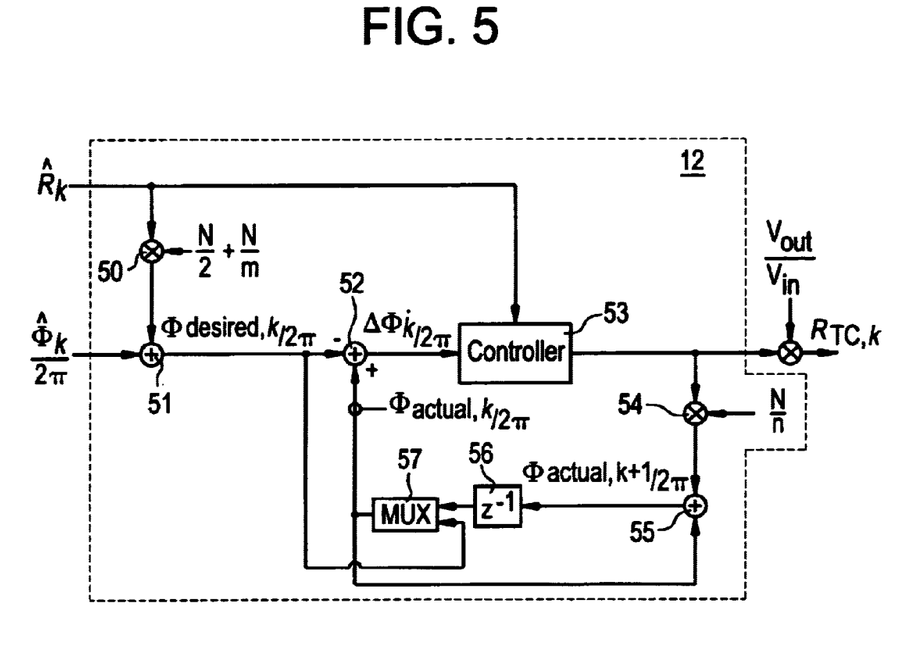
FIG. 5 illustrates a block diagram of a control device of the resampler according to the present invention.

FIG. 5 illustrates an exemplary embodiment of the control device 12. An estimated value for the sampling rate ratio $R_k$ and an estimated value—normalized to $2\pi$—for the phase $\Phi_k/2\pi$ are fed to the control device 12 n times per observation interval length N. The index k indexes the overlap regions N/n of the observation intervals (sub-observation intervals below), which are illustrated for n=6 in FIG. 7. In the exemplary embodiment of the estimation device 11 which is illustrated in FIG. 3, the estimation is effected in each case in the center of each observation interval. For the control, however, an estimated value is required at the beginning of the next observation interval. Therefore a phase offset of $(N/2) \cdot R_k$ has to be added to the estimated value $\Phi_k/2\pi$.

In the exemplary embodiment which is illustrated in FIG. 5 an additional phase offset of $N/m \cdot R_k$ is added, where m may be, for example, m=12. This additional offset serves for ensuring, even in the case of the maximum control deviation to be expected, that the resulting desired phase $\Phi_{desired,k}$ does not precede the beginning of the next observation interval. In the exemplary embodiment illustrated, the phase shift described above is formed by a multiplier 50, which, given a suitable choice of phase shift, can also be realized as a bit shifting operation (bit shifter), and an adder 51.

The phase $\Phi_{desired,k}/2\pi$ normalized to $2\pi$ is compared with the actual phase $\Phi_{actual,k}/2\pi$ normalized to $2\pi$. The deviation $\Delta\Phi_k/2\pi$ is determined in a subtractor 52 and fed to a controller 53. Furthermore, the estimated values for the sampling rate ratio $R_k$ are fed to the controller 53. The controller 53 operates in such a way that the control signal $R_{TC,k}$ formed at the output of the controller 53 essentially corresponds to the sampling rate ratio $R_k$ estimated in the preceding observation interval, but this is modified slightly on the basis of the controlled quantity $\Delta\Phi_k/2\pi$ in such a way that what is achieved by the control signal $R_{TC,k}$ is that, at the end of the, sub-observation interval of length N/n that is to be corrected, the actual phase $\Phi_{actual,k}$ corresponds to the desired phase $\Phi_{desired,k}$. In the settled state of the controller, $R_k$ ideally corresponds to the control signal $R_{TC,k}$.

The actual phase $\Phi_{actual,k}$—normalized to $2\pi$—of the output signal sequence $S_{out}$ is formed in such a way that the control signal $R_{TC,k}$, which represents the sampling rate ratio actually used by the timer 13, is multiplied by the overlapping sub-observation length N/n in a multiplier 54. In this case, too, the multiplier 54 can be replaced by a bit shifting operation (bit shifter), in order to avoid an actual multiplication. In this way, the phase shift during the k-th sub-observation interval is determined and fed to the adder 55, whose output is connected to a delay element 56 (register) which performs a shift by in each case the length of a sub-observation interval. Except for during the initialization that is yet to be described, the changeover element 57 is always switched such that its output is connected to the delay element 56. Consequently, the output of the delay element 56 is fed back to one of the inputs of the adder 55.

Since the output of the delay element (register) 56 represents the actual phase $\Phi_{actual,k}$ at the beginning of the k-th sub-observation interval, the actual phase $\Phi_{actual,k}$ at the beginning of the k+1-th sub-observation interval $\Phi_{actual,k+1}/2\pi$ is calculated by addition of the phase $\Phi_{actual,k}$ at the beginning of the k-th sub-observation interval and the phase shift caused in the k-th sub-observation interval. The actual phase is thus continuously updated taking account of the phase shift taking place in the respective present sub-observation interval.

The actual phase is not known at the beginning of the control. Therefore, at the beginning of the control, during the initialization, the output of the adder 51 is connected to the + input of the subtractor 52 via the changeover element (multiplexer MUX) 57, so that the controlled quantity $\Delta\Phi_k/2\pi$ is initially 0 on account of the identity of the input signals of the subtractor 52.

Figure 6:
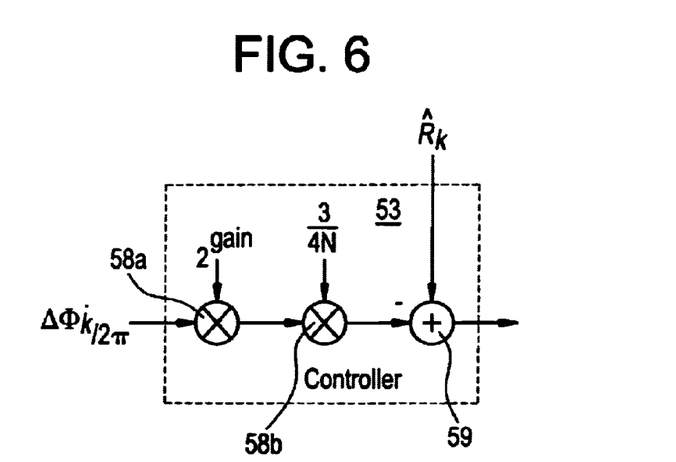
FIG. 6 illustrates a more detailed illustration of the controller of the control device illustrated in FIG. 5.
Figure 7:
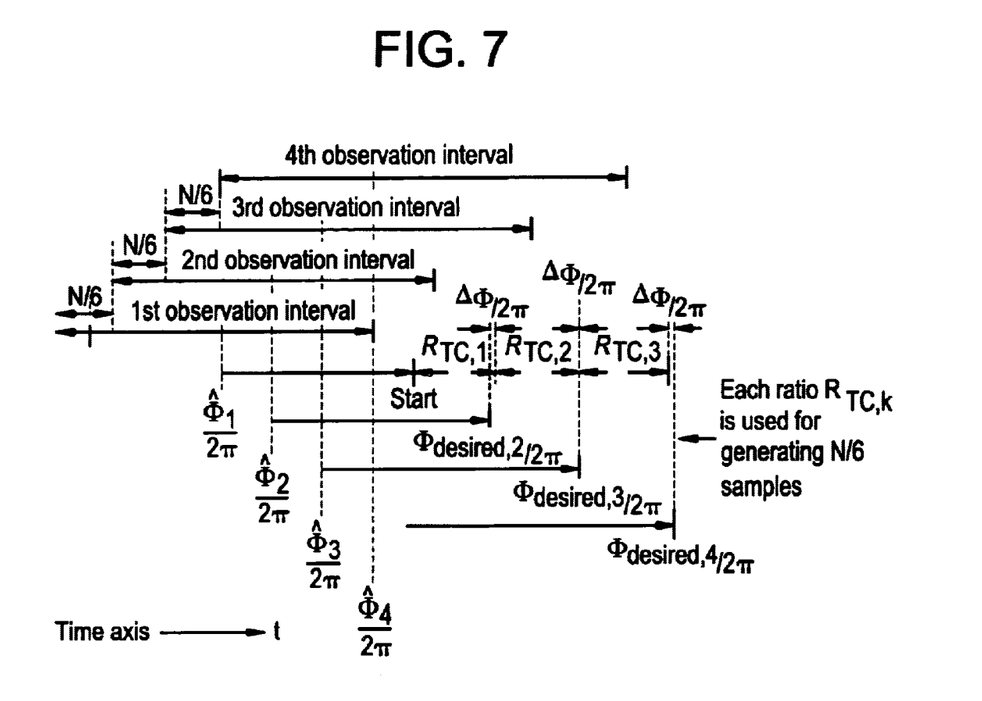
FIG. 7 illustrates a diagram for elucidating the method of operation of the control device illustrated in FIG. 5.

FIG. 6 illustrates an exemplary embodiment of the controller 53. In this exemplary embodiment, the controller 53 is designed as a proportional controller, i.e. the change performed on the estimated sampling rate ratio $R_k$ is proportional to the controlled quantity $\Delta\Phi_k/2\pi$, the proportionality factor being $2^{gain} \cdot 3/4N$ in the exemplary embodiment illustrated. The first variable proportionality factor $2^{gain}$ and the controlled quantity $\Delta\Phi_k/2\pi$ are fed to a first multiplier 58a which, given a suitable choice of proportionality factor, can be embodied as a bit shifting operation (bit shifter). The second fixed proportionality factor $3/4N$ and the output of the first multiplier 58a are fed to a second multiplier 58b, which may likewise be designed as a bit shifter. The actual control is effected by way of a subtractor 59, to which the output of the multiplier 58 and the estimated values of the sampling rate ratio $R_k$ are fed.

The variable proportionality factor $29^{gain}$ has the advantage that the control gain can be varied. The exponent gain may be a natural number, so that the control gain can be increased in 6 dB steps. By way of example, when the resampler 1 is started up, it is possible firstly to work with a relatively small gain (e.g. gain=0), in order to prevent the control from becoming unstable. The gain can then slowly be boosted in steps. The gain factor is preferably chosen such that the aperiodic limiting case is reached without excitation of control oscillations.

The mode of operation of the control device 12 illustrated in FIG. 5 is explained in more detail with reference to FIG. 7. In the first observation interval (the first n sub-observation intervals), no control can yet be performed since the estimated values $R_1$ and $\Phi_1$ are determined for the first time in this observation interval. In the n+1-th sub-observation interval, the changeover device (multiplexer) 57 defines the start phase $\Phi_{start}/2\pi$, to which the actual phase of the control device 12 is initialized. At the end of the n+1-th sub-observation interval, it is possible for the first time to determine the controlled quantity $\Delta\Phi_2/2\pi$, which represents the deviation of the actual phase from the desired phase at the end of the second observation interval. In the example illustrated in FIG. 7, the clock $f_{out}$ was too large during the n+1-th observation interval. The clock $f_{out}$ is reduced during the n+2-th observation interval in such a way that, at the end of the n+3-th observation interval, the actual phase ideally corresponds exactly to the desired phase. n=6 holds true in the example illustrated.

The control according to the present invention continually readjusts the sampling rate ratio, in particular when the input sampling rate $f_{in}$ or the output sampling rate $f_{out}$ changes. A change in the occupancy of the buffer memory (FIFO) 6 can be avoided in the settled state of the control; so that there are no relatively large changes in the group delay through the resampler 1.

Figure 9:
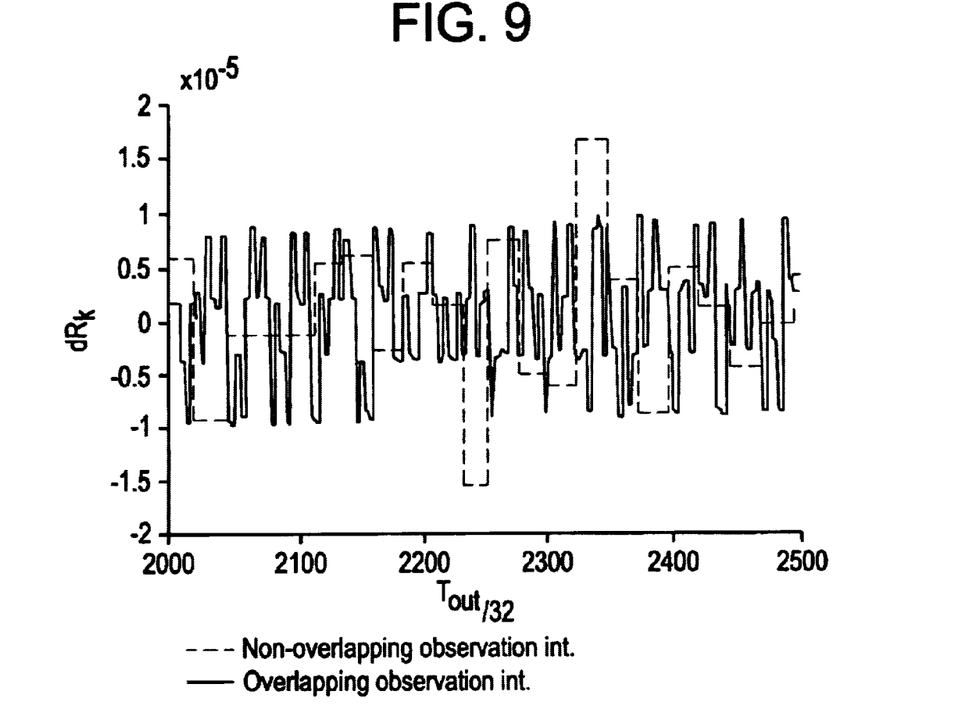
FIG. 9 illustrates a diagram for elucidating the control with and without overlapping observation intervals.

FIG. 9 illustrates a comparison between a control with non-overlapping observation intervals and a control with overlapping observation intervals for the exemplary case n=6. The absolute change $dR_k$ of the sampling rate ratio $R_k$ is plotted as a function of the sampling instants of the output signal sequence $S_{out}$. It can be seen that the control deviation $dR_k$ is smaller in the case of overlapping observation intervals than in the case of non-overlapping observation intervals, since it is possible to react earlier to incorrect estimations.

Figure 10:
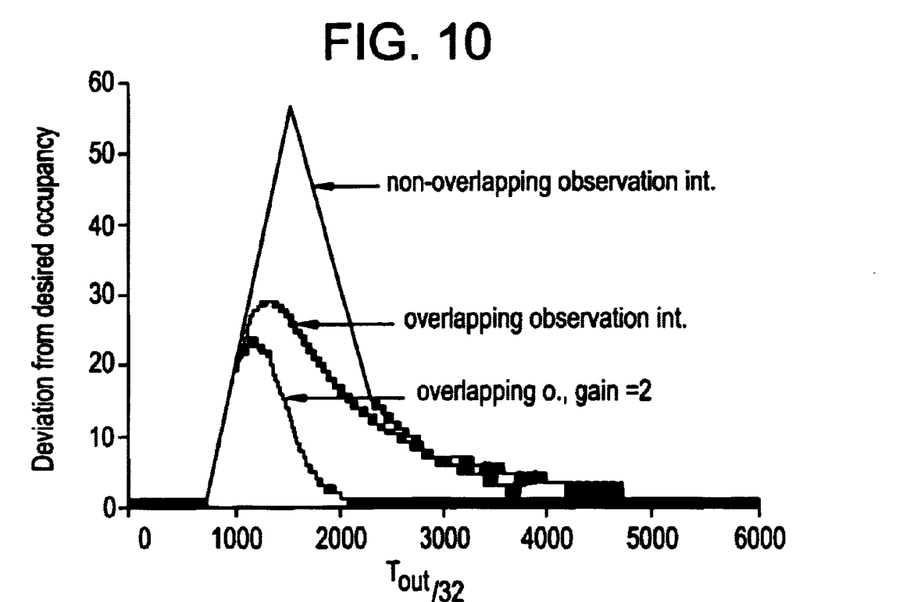
FIG. 10 illustrates a diagram for elucidating the reaction time of a control with and without overlapping observation intervals.

What is even more important than a reduction of the deviation $dR_k$ of the sampling rate ratio $R_k$ is the reduced deviation—illustrated in FIG. 10—from the desired occupancy of the buffer memory 6 when using overlapping observation intervals. FIG. 10 shows an example for a large abrupt change in the ratio, FIG. 10 illustrating the deviation from the desired occupancy of the buffer memory (FIFO) 6 as a function of the sampling instants of the output signal sequence $S_{out}$. Even in the case of an identical gain factor (gain=0), a significantly smaller deviation from the desired occupancy occurs in the case of an overlap of the observation intervals in the ratio 1:6. If the gain factor gain is additionally set to 2, an even smaller deviation from the desired occupancy is achieved.

The present invention is not restricted to the exemplary embodiment illustrated. In particular, the estimation device 11 can also be configured differently than is illustrated in FIG. 3. Moreover, different realizations from those illustrated in FIGS. 4 and 5 are conceivable for the control device 12 and the timer 13. The present invention can also be employed for a resampler 1 in up-sampling operation, in which case, in FIG. 2, the functions of $f_{in}$ and $f_{out}$ are to be interchanged and the buffer memory (FIFO) 6 is to be arranged upstream of the interpolator 7.

What is claimed is:

1. An apparatus for converting a digital input signal sequence ($S_{in}$) with an input sampling rate ($f_{in}$) into a digital output signal sequence ($S_{out}$) with an output sampling rate ($f_{out}$), having an estimation device, which estimates the sampling rate ratio ($R_k$) between the input sampling rate ($f_{in}$) and the output sampling rate ($f_{out}$) and a desired phase ($\Phi_{desired,k}$) of the output signal sequence ($S_{out}$) in an observation interval with a predetermined length of N samples of the output signal sequence $S_{out}$, the observation intervals overlapping in the ratio 1:n;

a control device connected to the estimation device, the control device compares an actual phase ($\Phi_{actual,k}$) of the output signal sequence ($S_{out}$) with the desired phase ($\Phi_{desired,k}$) of the output signal sequence ($S_{out}$) and, in a manner dependent on the estimated sampling rate ratio ($R_k$) and a deviation ($\Delta\Phi_k$) of the actual phase ($\Phi_{actual,k}$) from the desired phase ($\Phi_{desired,k}$), generates a control signal ($R_{TC,k}$) for in each case N/n samples of the output signal sequence $S_{out}$; and an interpolator, which interpolates the input signal sequence ($S_{in}$) for the purpose of generating the output signal sequence ($S_{out}$) at sampling instants (t'$_1$, t'$_2$, ... t'$_6$) whose temporal position is predetermined by a control signal ($R_{TC,k}$).

2. The apparatus as claimed in claim 1, wherein a controller is provided in the control device, the controller increases or decreases the sampling rate ratio ($R_k$) with increasing deviation ($\Delta\Phi_k$) of the actual phase ($\Phi_{actual,k}$) from the desired phase ($\Phi_{desired,k}$) for the purpose of generating the control signal ($R_{TC,k}$).

3. The apparatus as claimed in claim 1, wherein the control device keeps the control signal ($R_{TC,k}$) constant for in each case N/n samples of the output signal sequence ($S_{out}$) and then updates it.

4. The apparatus as claimed in claim 3, wherein the controller is a proportional controller which increases or decreases the sampling rate ratio ($R_k$) proportionally to the deviation ($\Delta\Phi_k$) of the actual phase ($\Phi_{actual,k}$) from the desired phase ($\Phi_{desired,k}$), and the proportionality factor is continuously variable or variable in steps.

5. A method for converting a digital input signal sequence ($S_{in}$) with an input sampling rate ($f_{in}$) into a digital output signal sequence ($S_{out}$) with an output sampling rate ($f_{out}$), comprising:

estimating the sampling rate ratio ($R_k$) between the input sampling rate ($f_{in}$) and the output sampling rate ($f_{out}$) and a desired phase ($\Phi_{desired,k}$) of the output signal sequence ($S_{out}$) in an observation interval with a predetermined length of N samples of the output signal sequence $S_{out}$, the observation intervals overlapping in a ratio N/n, comparing the actual phase ($\Phi_{actual,k}$) of the output signal sequence ($S_{out}$) with the desired phase ($\Phi_{desired,k}$) of the output signal sequence ($S_{out}$), generating a control signal ($R_{TC,k}$) in a manner dependent on the estimated sampling rate ratio ($R_k$) and the deviation ($\Delta\Phi_k$) of the actual phase ($\Phi_{actual,k}$) from the desired phase ($\Phi_{desired,k}$) for in each case N/n samples of the output signal sequence $S_{out}$, and interpolating the input signal sequence ($S_{in}$) for the purpose of generating the output signal sequence ($S_{out}$) at sampling instants ($t'_1$, $t'_2$, ... $t'_6$) whose temporal position is predetermined by a control signal ($R_{TC,k}$).

6. The method as claimed in claim 5, wherein the sampling rate ratio ($R_k$) is increasingly increased or decreased with increasing deviation ($\Delta\Phi_k$) of the actual phase ($\Phi_{actual,k}$) from the desired phase ($\Phi_{desired,k}$) for the purpose of generating the control signal ($R_{TC,k}$).

7. The method as claimed in claim 6, wherein the control signal ($R_{TC,k}$) is kept constant for in each case N/n samples of the output signal sequence $S_{out}$ and is then updated.

8. The method as claimed in claim 6, wherein the sampling rate ratio ($R_k$) is increased or decreased proportionally to the deviation ($\Delta\Phi_k$) of the actual phase ($\Phi_{actual,k}$) from the desired phase ($\Phi_{desired,k}$) and the proportionality factor is varied continuously or in steps.

9. The apparatus as claimed in claim 2, wherein the control device keeps the control signal ($R_{TC,k}$) constant for in each case N/n samples of the output signal sequence ($S_{out}$) and then updates it.

10. The method as claimed in claim 7, wherein the sampling rate ratio ($R_k$) is increased or decreased proportionally to the deviation ($\Delta\Phi_k$) of the actual phase ($\Phi_{actual,k}$) from the desired phase ($\Phi_{desired,k}$) and the proportionality factor is varied continuously or in steps.

* * * * *